United States Patent
Devaal et al.

(10) Patent No.: US 10,895,604 B2
(45) Date of Patent: Jan. 19, 2021

(54) REDUCED STACK VOLTAGE CIRCUITRY FOR ENERGY STORAGE SYSTEM DIAGNOSTICS

(71) Applicants: Ballard Power Systems Inc., Burnaby (CA); Simon Fraser University, Burnaby (CA)

(72) Inventors: Jacob W. Devaal, Coquitlam (CA); Hooman Homayouni, Burnaby (CA); Farid Golnaraghi, West Vancouver (CA)

(73) Assignees: Ballard Power Systems Inc., Burnaby (CA); Simon Fraser University, Burnaby (CA)

( * ) Notice: Subject to any disclaimer, the term of this patent is extended or adjusted under 35 U.S.C. 154(b) by 322 days.

(21) Appl. No.: 15/744,470

(22) PCT Filed: Jul. 13, 2016

(86) PCT No.: PCT/US2016/042149
§ 371 (c)(1),
(2) Date: Jan. 12, 2018

(87) PCT Pub. No.: WO2017/015038
PCT Pub. Date: Jan. 26, 2017

(65) Prior Publication Data
US 2018/0203074 A1    Jul. 19, 2018

Related U.S. Application Data

(60) Provisional application No. 62/194,073, filed on Jul. 17, 2015.

(51) Int. Cl.
*G01R 31/389*    (2019.01)
*G01R 31/3835*   (2019.01)
(Continued)

(52) U.S. Cl.
CPC ......... *G01R 31/389* (2019.01); *G01N 27/026* (2013.01); *G01N 27/416* (2013.01);
(Continued)

(58) Field of Classification Search
CPC .............. G01N 27/026; G01N 27/416; H01M 2008/1095; H01M 8/1018; H03L 5/00;
(Continued)

(56) References Cited

U.S. PATENT DOCUMENTS 4,180,781 A * 12/1979 Kaplan ................... H03F 1/307
                                                   330/255
5,773,978 A    6/1998 Becker
(Continued)

FOREIGN PATENT DOCUMENTS

CN    1189216 A    7/1998
CN    1234644 A    11/1999
(Continued)

OTHER PUBLICATIONS

First Office Action for CN application No. 201680042021.7 dated Jul. 31, 2019, 6 pages, with machine English Translation.
(Continued)

*Primary Examiner* — Elias Desta
(74) *Attorney, Agent, or Firm* — Seed IP Law Group LLP

(57) ABSTRACT

Systems and methods to provide a low voltage interface coupleable between an energy storage device or a DC power source (e.g., fuel cell stack, battery) and one or more AC signal diagnostic systems. The low voltage interface reduces a voltage of the DC power source and supplies the reduced voltage to the one or more AC signal diagnostic systems without affecting the results of the measurements obtained by the one or more AC signal diagnostic systems. Such functionality provides a safer method for performing
(Continued)

advanced analysis (e.g., EIS, frequency analysis) while utilizing lower cost and/or smaller components.

32 Claims, 10 Drawing Sheets

(51) Int. Cl.
 G01N 27/02 (2006.01)
 G01N 27/416 (2006.01)
 H01M 8/1018 (2016.01)
 H03L 5/00 (2006.01)

(52) U.S. Cl.
 CPC ...... *G01R 31/3835* (2019.01); *H01M 8/1018* (2013.01); *H03L 5/00* (2013.01); *H01M 2008/1095* (2013.01)

(58) Field of Classification Search
 CPC .............. G01R 31/362; G01R 31/3662; G01R 31/3835; G01R 31/389
 See application file for complete search history.

(56) References Cited

U.S. PATENT DOCUMENTS

| | | | | |
|---|---|---|---|---|
| 6,411,098 | B1* | 6/2002 | Laletin | G01R 31/385 324/436 |
| 2008/0012661 | A1 | 1/2008 | Kim et al. | |
| 2012/0105066 | A1 | 5/2012 | Marvin et al. | |

FOREIGN PATENT DOCUMENTS

| | | |
|---|---|---|
| CN | 102201741 A | 9/2011 |
| CN | 102759945 B | 6/2014 |
| CN | 104662730 A | 5/2015 |
| EP | 1 699 101 A1 | 9/2006 |
| JP | 2012-42419 A | 3/2012 |
| WO | 97/36182 A1 | 10/1997 |
| WO | 03/098769 A2 | 11/2003 |
| WO | 2015/127133 A1 | 8/2015 |

OTHER PUBLICATIONS

Communication pursuant to Article 94(3) EPC for EP application No. 16 741 787.2 dated Feb. 14, 2019.
Brunetto et al., "PEM fuel cell testing by electrochemical impedance spectroscopy," *Electric Power Systems Research* 79:17-26, 2009.
Homayouni et al., "Reduced Stack Voltage Circuitry for Energy Storage System Diagnostics," U.S. Appl. No. 62/194,073, filed Jul. 17, 2015, 42 pages.
Huang et al., "Experimental investigation of pinhole effect on MEA/cell aging in PEMFC," *International Journal of Hydrogen Energy* 38:543-550, 2013.
International Search Report and the Written Opinion of the International Searching Authority, dated Sep. 28, 2016, for International Application No. PCT/US2016/042149, 14 pages.
Lin et al., "Investigation of Membrane Pinhole Effects in Polymer Electrolyte Fuel Cells by Locally Resolved Current Density," *Journal of the Electrochemical Society* 158(1):B11-B17, 2011.
Lobato et al., "The neural networks based modeling of a polybenzimidazole-based polymer electrolyte membrane fuel cell: Effect of temperature," *Journal of Power Sources* 192:190-194, 2009.
Mousa et al., "Use of Neutral Network and EIS Signal Analysis to Quantify H2 Crossover In-Situ in Operating PEM Cells," U.S. Appl. No. 61/941,927, filed Feb. 19, 2014, 30 pages.
Nakamura et al., "Measurement of Leak Current Generation Distribution in PEFC and its Application to Load Fluctuation Testing Under Low Humidification," *Electrical Engineering in Japan* 174(1):1-9, 2011.
Soliman et al., "Active Compensation of Opamps," *IEEE Transactions on Circuits and Systems* CAS-26(2):112-117, 1979.
Weber, "Gas-Crossover and Membrane-Pinhole Effects in Polymer-Electrolyte Fuel Cells," *Journal of the Electrochemical Society* 155(6):B521-B531, 2008.
Yousfi Steiner et al., "Model-based diagnosis for proton exchange membrane fuel cells," *Mathematics and Computers in Simulation* 81:158-170, 2010.

\* cited by examiner

REDUCED STACK VOLTAGE CIRCUITRY FOR ENERGY STORAGE SYSTEM DIAGNOSTICS

BACKGROUND

Technical Field

The present disclosure generally relates to diagnostics for energy storage systems.

Description of the Related Art

Proton exchange membrane (PEM) fuel cells are one of the most important types of fuel cells due to their ability to work at low temperature, and their low weight and volume. This has made PEM fuel cells a competitive alternative power source in stationary and automotive applications. However, the extensive use of PEM fuel cells depends on their reliability and cost efficiency. Over the years, the fuel cell industry has developed more durable membrane electrode assembly (MEA) to avoid failures and extend the operating lifetime, but PEM fuel cells remain vulnerable to hydrogen leaks which can lead to performance degradation and potential safety issues. While the onset of membrane degradation can be delayed, the initiation of MEA pinholes is inevitable with existing technology measures.

Due to the existence of pinholes in the MEA, hydrogen may leak through the MEA from the anode to the cathode. At sufficient rates of hydrogen crossover leak, the fuel cell performance drops due to the direct recombination with reactant oxygen on the cathode side. This recombination affects the available amount of oxygen used for the electrochemical reaction. In severe cases, the fuel cell might suffer fuel and/or air starvation. Direct recombination of fuel with oxygen results in the formation of water on the cathode side, leading to air starvation of the affected cell because of the consumption of oxygen and/or water accumulation in the cathode.

Prior work dealing with MEA pinholes is limited. Weber (Adam Z. Weber, "Gas-Crossover and Membrane-Pinhole Effects in Polymer-Electrolyte Fuel Cells," Journal of Electrochemical Society, 155 (6) B521-6531, 2008) developed a mathematical model to simulate the effect of pinholes in a PEM fuel cell. Weber showed the performance drop in terms of cell voltage and current density. The drop in current density was also considered by Lin et al. (R. Lin, E. Gülzow, M. Schulze and K. A. Friedrich, "Investigation of Membrane Pinhole Effects in Polymer Electrolyte Fuel Cells by Locally Resolved Current Density," Journal of The Electrochemical Society, 158 (1) B11-B17, 2011). Hydrogen leak can also be detected by monitoring the increase of leakage current and drop in voltage. (Soshin Nakamura, Eiichi Kashiwa, Hidetoshi Sasou, Suguru Hariyama, Tsutomu Aoki, Yasuji Ogami and Hisao Nishikawa, "Measurement of Leak Current Generation Distribution in PEFC and Its Application to Load Fluctuation Testing Under Low Humidification," Electrical Engineering in Japan, Vol. 174, No. 1, 2011; B. T. Huang, Y. Chatillon, C. Bonnet, F. Lapicque, S. Leclerc, M. Hinaje, S. Rael, "Experimental investigation of pinhole effect on MEA/cell aging in PEMFC," International journal of hydrogen energy 38: 543-550, 2013) However, detecting small hydrogen leaks by measuring the cell voltage may not be feasible where the degradation in voltage is minimal with gradually increasing of leakage rates.

These studies have also only dealt with a single, small-sized MEA. In actual industrial applications, larger stacks containing multiple unit cells in series are used to provide large amounts of power; that is, on the order of tens of kilowatts. Because of the large size and a lack of appropriate models, a stack of this size requires a diagnostic tool that is able to detect hydrogen leaks in operation and quantify the hydrogen leak rate effectively. Knowing the amount or rate of hydrogen leakage during fuel cell operation may facilitate the establishment of mitigation criteria to reduce its effect on stack performance.

The word "diagnostic" usually implies detection, isolation and identification of faults. Hydrogen crossover leaks at different rates in PEM cells are detectible by using electrochemical impedance spectroscopy (EIS).

Neural networks are used in fault diagnostics, to represent the complex behavior of the fuel cell system without the need of deriving a mathematical model. (see, e.g., N. Yousfi-Steiner, D. Candusso, D. Hissel, Ph. Mocoteguy, "Model-based diagnosis for proton exchange membrane fuel cells," Mathematics and Computers in Simulation 81: 158-170, 2010; Justo Lobato, Pablo Canizares, Manuel A. Rodrigo, Jose J. Linares, Ciprian-George Piuleac, Silvia Curteanu, "The neural networks based modeling of a polybenzimidazole-based polymer electrolyte membrane fuel cell: Effect of temperature," Journal of Power Sources 192: 190-194, 2009). Due to consistent patterns of impedance signatures and a large set of data being entered into the neural network, the effect of leak rate on the fuel cell system can be assessed without the need of prior knowledge of the interior mass and heat transfer encountered.

Electrochemical impedance spectroscopy (EIS) is an experimental technique that can be used to perform impedance measurements over a wide frequency range for DC power generation devices. The main advantage of EIS is the possibility to resolve, in the frequency domain, the individual contributions that affect the overall PEM fuel cell performance under load conditions. (See C. Brunetto, A. Moschetto, G. Tina, "PEM fuel cell testing by electrochemical impedance spectroscopy," Electr. Power Syst. Res. 79: 17-26, 2009) The effect of hydrogen leaks on a single cell can be evaluated using an EIS method. In order to establish impedance behavior at different hydrogen leak rates, the impedance signatures of reduced oxygen concentrations in the cathode are compared with and thus mapped to impedance signatures of the hydrogen leaks. These fault impedance signatures are then used to detect reverse potential faults in a stack or the outcomes thereof.

EIS usually employs a frequency response analyzer (FRA) to apply either a small AC voltage or current perturbation signal to a cell, and to measure its output signal for a wide frequency range. The impedance is calculated by dividing the voltage by current, in the form of a magnitude and phase angle, at each specific frequency. Impedance spectroscopy has the ability to characterize many of the electrical properties of materials and their interfaces with electrodes. This ability has made the EIS technique widely used in modeling and diagnostics of PEM fuel cells, where individual contributions affecting cell performance can be distinguished by fitting the impedance spectrum into parameters of an equivalent circuit model. Electrical circuits with different configurations, components, and degree of complexity have been proposed in the literature.

In motive-type DC power generation devices, which may have operating voltages of approximately 300-800 volts (V), for example, performing diagnostics at such high voltages may provide insufficient high voltage to low voltage isolation, and requires the use of relatively high cost, higher voltage signal processing electronics.

BRIEF SUMMARY

Accordingly, the present inventors have determined that it would be advantageous to provide a reduced voltage representation of a DC power generation device, such as a fuel cell system or a battery module, which allows for diagnostic systems to operate efficiently while reducing or eliminating the hazard of high voltage shock, improving stack high voltage to low voltage isolation, and permitting the use of lower-cost, lower-voltage signal processing electronics.

A low voltage interface which in use couples a direct current (DC) power source to an alternating current (AC) signal diagnostic system, the DC power source including a positive node, the AC signal diagnostic system including a diagnostic signal output node which applies an AC signal to the DC power source, the AC signal diagnostic system further includes a measurement input node, the low voltage interface may be summarized as including: an interface input node electrically coupleable to the positive node of the DC power source; a first interface output node electrically coupleable to the measurement input node of the AC signal diagnostic system; and a voltage-reduction circuit electrically coupled to the interface input node and the first interface output node, the voltage-reduction circuit: may receive an input voltage from the DC power source via the interface input node, the input voltage comprising a DC component and an AC component; may reduce the DC component of the input voltage without substantially affecting a magnitude or phase of the AC component of the input voltage, or reduce the DC component of the input voltage with a constant amplification or a constant phase shift of the AC component of the input voltage, which provides a measurement voltage; and may provide the measurement voltage to the measurement input node of the AC signal diagnostic system via the first interface output node.

The voltage-reduction circuit may include a DC voltage source electrically coupled in series between the interface input node and the first interface output node, and may maintain a zero or constant phase between the interface input node and the first interface output node. The voltage-reduction circuit may reduce the DC component of the input voltage without substantially affecting the magnitude or phase of the AC component of the input voltage, or reduce the DC component of the input voltage with a constant amplification or phase shift of the AC component of the input voltage, for AC signals having a frequency between 0.01 Hz and 5000 Hz. The voltage-reduction circuit may include at least one resistor electrically coupled in series with a biasing current source. The voltage-reduction circuit may include at least one Zener diode electrically coupled in series with a biasing current source. The voltage-reduction circuit may include a $V_{BE}$ multiplier circuit electrically coupled in series with a biasing current source. The biasing current source may provide a zero- or constant-phase current response with respect to the output voltage. The voltage-reduction circuit may include one of at least one resistor electrically coupled in series with a biasing current source, at least one Zener diode electrically coupled in series with a biasing current source, and a $V_{BE}$ multiplier circuit electrically coupled in series with a biasing current source, the biasing current source having an input impedance which is at least 10 times greater than the impedance of the at least one resistor, or the at least one Zener diode, or the $V_{BE}$ multiplier circuit. The voltage-reduction circuit may reduce the DC component of the input voltage to a voltage of less than 60 volts. The first interface output node may be electrically coupleable to at least one of a load of the AC signal diagnostic system or a system load driven by the DC power source. The voltage-reduction circuit may include: a second interface output node electrically coupleable to the diagnostic signal output node of the AC signal diagnostic system, wherein the voltage-reduction circuit: reduces the DC component of the input voltage without substantially affecting the phase of the AC component of the input voltage, or reduces the DC component of the input voltage with a constant phase shift of the AC component of the input voltage, or reduces the DC component of the input voltage without substantially affecting the magnitude of the AC component of the diagnostic signal output node, which provides a reduced voltage; and provides the reduced voltage to the diagnostic signal output node of the AC signal diagnostic system via the second interface output node. The voltage-reduction circuit may include at least one resistor electrically coupled in series between the interface input node and the second interface output node. The voltage-reduction circuit may include at least one Zener diode electrically coupled in series between the interface input node and the second interface output node. The voltage-reduction circuit may include at least one of a controlled voltage source or a constant-voltage load bank electrically coupled in series between the interface input node and the second interface output node. Reducing the DC component of the input voltage may include applying the input voltage to a circuit that has a current source with a zero- or constant-phase current response with respect to the output voltage. The voltage-reduction circuit may include a controlled voltage source with at least one of active phase compensation or passive phase compensation.

A direct current (DC) power system may be summarized as including: a DC power source comprising a positive node; alternating current (AC) signal diagnostic system including a diagnostic signal output node which applies an AC signal to the DC power source, the AC signal diagnostic system further including a measurement input node; and a low voltage interface including: an interface input node electrically coupled to the positive node of the DC power source; a first interface output node electrically coupled to the measurement input node of the AC signal diagnostic system; and a voltage-reduction circuit electrically coupled to the interface input node and the first interface output node, the voltage-reduction circuit: may receive an input voltage from the DC power source via the interface input node, the input voltage comprising a DC component and an AC component; may reduce the DC component of the input voltage without substantially affecting a magnitude or phase of the AC component of the input voltage, or reduce the DC component of the input voltage with a constant amplification or constant phase shift of the AC component of the input voltage, which provides a measurement voltage; and may provide the measurement voltage to the measurement input node of the AC signal diagnostic system via the first interface output node.

The DC power source may include a fuel cell stack. The AC signal diagnostic system may include an electrochemical impedance spectroscopy (EIS) system.

A method may be summarized as including: receiving an input voltage at an interface input node of a low voltage interface electrically coupled to a positive node of a direct current (DC) power source, the input voltage including a DC component and an AC component; reducing the DC component of the input voltage without substantially affecting a magnitude or phase of the AC component of the input voltage, or reducing the DC component of the input voltage with a constant amplification or constant phase shift of the AC component of the input voltage, to generate a measurement voltage; and providing the measurement voltage to a measurement input node of an AC signal diagnostic system via a first interface output node electrically coupled to a measurement input node of the AC signal diagnostic system, the AC signal diagnostic system including a diagnostic signal output node which in use applies an AC signal to the DC power source.

Reducing the DC component of the input voltage may include applying the input voltage to a circuit that has a DC voltage source electrically coupled in series between the interface input node and the first interface output node, and maintaining zero or constant phase between the interface input node and the first interface output node. Reducing the DC component of the input voltage may include applying the input voltage to a circuit that has at least one resistor electrically coupled in series with the interface input node and the first interface output node. Reducing the DC component of the input voltage may include applying the input voltage to a circuit that has at least one Zener diode electrically coupled in series with the interface input node and the first interface output node. Reducing the DC component of the input voltage may include applying the input voltage to a circuit that has a $V_{BE}$ multiplier circuit electrically coupled in series with the interface input node and the first interface output node. Reducing the DC component of the input voltage may include applying the input voltage to a circuit that has a current source with zero- or constant-phase current response with respect to the output voltage. Reducing the DC component of the input voltage may include applying the input voltage to a circuit that has one of: at least one resistor electrically coupled in series with a the interface input node and the first interface output node, at least one Zener diode electrically coupled in series with the interface input node and the first interface output node, or a $V_{BE}$ multiplier circuit electrically coupled in series with the interface input node and the first interface output node, and reducing the DC component of the input voltage may include applying the input voltage to a circuit that has a current source with zero- or constant-phase current response with respect to output voltage, or having an input impedance which is at least 10 times greater than the impedance of the at least one resistor, or at least one Zener diode, or the $V_{BE}$ multiplier circuit. Reducing the DC current of the input voltage may include reducing the DC component of the input voltage to a voltage of less than 60 volts. The method may further include: reducing the DC component of the input voltage without substantially affecting a phase of the AC component of the input voltage, or reducing the DC component of the input voltage with a constant phase shift of the AC component of the input voltage, or reducing the DC component of the input voltage without substantially affecting the magnitude of the AC component of the diagnostic signal output node, to generate a reduced voltage; and providing the reduced voltage to the diagnostic signal output node of the AC signal diagnostic system via a second interface output node. Reducing the DC current of the input voltage may include applying the input voltage to a circuit that comprises at least one of a controlled voltage source or a constant-voltage load bank electrically coupled in series between the interface input node and the second interface output node. Applying the input voltage to a circuit may include applying the input voltage to a circuit that comprises a controlled voltage source with at least one of active phase compensation or passive phase compensation.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with DC power sources, systems, or circuit and/or analyzers have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the implementations.

Implementations of the present disclosure are directed to systems and methods for reducing a voltage of an energy storage device or DC power source (e.g., fuel cell stack, battery) which is supplied to one or more AC signal diagnostic systems without affecting the results of the measurements obtained by the one or more diagnostic systems. Such operation provides a reliable and efficient method for performing advanced analysis (e.g., EIS, frequency analysis) while utilizing lower cost components.

Figure 1:
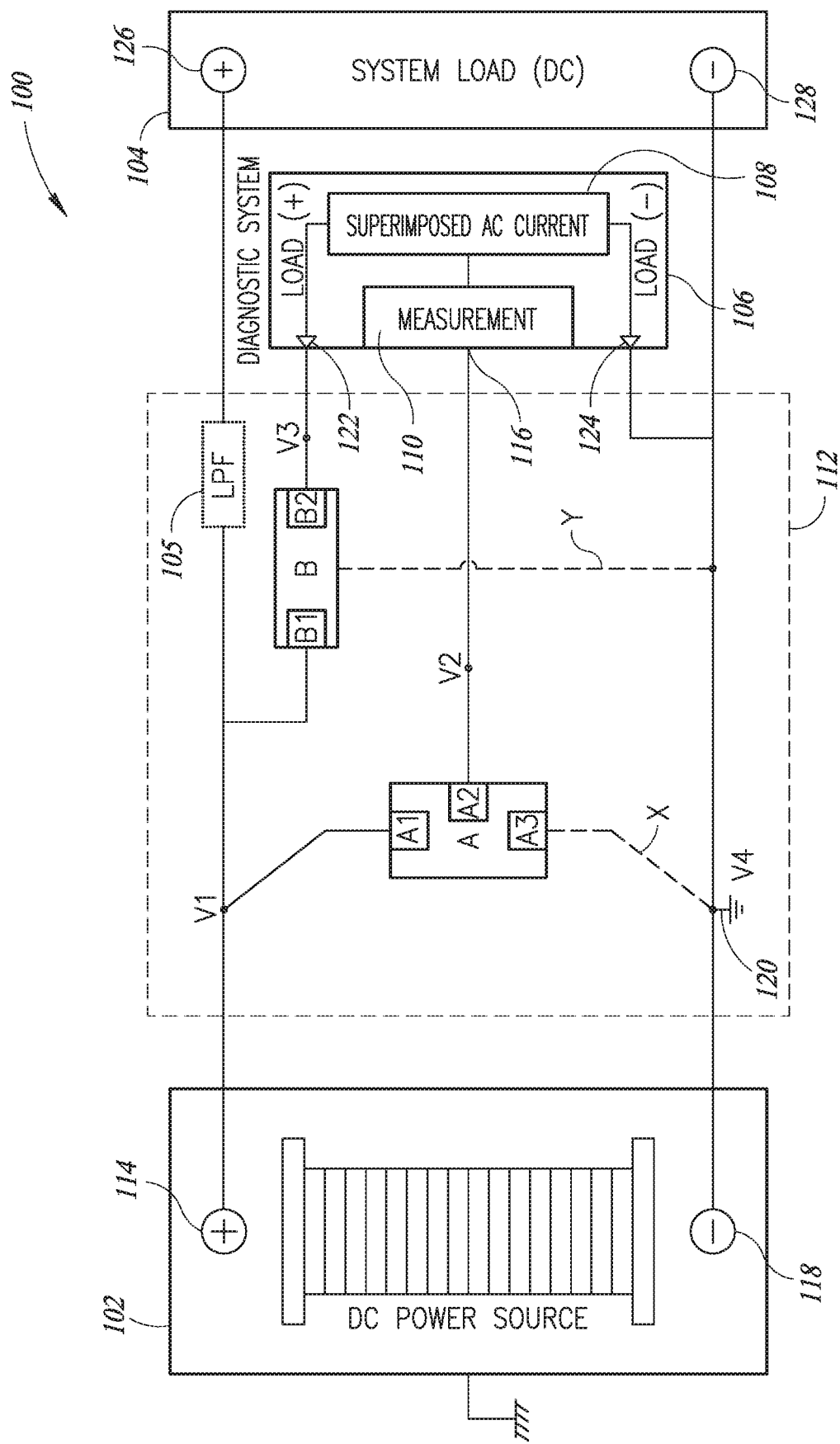
FIG. 1 is a schematic diagram of a direct current (DC) powered device which includes a low voltage interface coupled between a DC power source and a diagnostic system, according to one illustrated implementation.

FIG. 1 shows a schematic diagram of various components of a DC powered device or system 100, such as an electric vehicle, power grid, backup power system, etc. The DC powered device 100 includes DC power source 102, such as a fuel cell stack or a battery stack. The DC powered device 100 may supply power to a DC system load 104 coupled to the DC power source 102. In particular, a positive node 114 of the DC power source 102 is coupled to a positive node 126 of the DC system load 104, optionally via a low pass filter 105. A negative node 118 of the DC power source 102 is coupled to a negative node 128 of the DC system load 104. The DC system load 104 may be an electric motor or other suitable DC load, for example.

The DC powered device 100 also includes an AC signal diagnostic system 106, such as an EIS system or a total harmonic distortion analysis (THDA) system, which is used to impose a small amplitude AC signal to the DC power source 102 via a superimposed AC current and load generator 108. Non-limiting examples of such systems include a Kikusui Model KFM 2150 FC Impedance Meter with one or more Electronic Load modules (e.g., Model PLZ664WA), or a Solartron Model 1286 Electrochemical Interface with a Model SI 1255 HF Frequency Response Analyzer. The AC voltage and current response of the DC power source 102 is analyzed by a measurement subsystem 110 of the diagnostic system 106 to determine one or more characteristics (e.g., impedance) of the DC power source at one or more frequencies. In some implementations, EIS may be utilized to identify and quantify various physicochemical processes occurring within the DC power source 102.

As discussed further below, AC signal analysis is used to assess the health of the DC power source 102 and, in some implementations, to identify the existence of unwanted mixed AC/DC circuits, for example, to identify if there is AC leakage into the high-voltage direct-current (HVDC) bus circuit from AC circuits. By moving the diagnostic system 106 to low-voltage DC (LVDC) using the techniques disclosed herein, the probability of losing HVDC isolation due to equipment failure or due to human errors during maintenance is greatly reduced. Further, since the diagnostic system 106 operates at a lower voltage, the probability of failure within the diagnostic equipment is lowered as well.

The DC powered device 102 includes a low voltage interface 112 which includes a zero- or constant-phase, DC-only voltage reducing circuit A electrically coupled between a positive node 114 of the DC power source 102 and a reduced voltage measurement node 116 of the diagnostic system 106. In particular, the circuit A includes an input node A1 electrically coupled to the positive node 114 of the DC power source 102, an output node A2 electrically coupled to the reduced voltage measurement node 116 of the diagnostic system 106, and a node A3 electrically coupled to a negative node 118 of the DC power source, which is electrically coupled to a ground reference 120.

The low voltage interface 112 also includes a zero- or constant-phase voltage reducing circuit B electrically coupled between the positive node 114 of the DC power source and a positive output node 122 of the diagnostic system 106 which provides a superimposed AC current signal for constant AC gain. In particular, the circuit B includes an input node B1 electrically coupled to the positive node 114 of the DC power source 102 and an output node B2 electrically coupled to the positive output node 122 of the diagnostic system 106. A negative output node 124 of the diagnostic system 106 is electrically coupled to the ground reference 120.

The circuits A and B may be used separately or together depending on the particular type of measurement being obtained and/or dependent on the particular equipment included in the diagnostic system 106. In FIG. 1, a voltage V1 is the voltage at the positive node 114 of the DC power source 102 with respect to a voltage V4 at the negative node 118 of the DC power source, which in this illustrated implementation is also the ground reference 120. A voltage V2 is a reduced voltage from the voltage V1 provided by the circuit A at the output node A2, and a voltage V3 is a reduced voltage from the voltage V1 provided by the output node B2 of the circuit B.

While component failures in the circuits A or B may occur, the use of reduced voltages and low current, especially in the circuit A, makes them inherently more reliable. In case of failure, the loss of HVDC isolation is not significant, and it is much easier to detect and isolate the failure in the circuits A or B by simply monitoring their output voltages.

The circuit A reduces only the DC component of the voltage V1 without affecting (substantially) the magnitude or phase of the AC component(s) of the voltage V1, and/or with only introducing a constant amplification or phase shift of the AC component(s) of the voltage V1 (i.e., the circuit A has substantially zero reactance and, ideally, substantially zero resistance). Such may be accomplished by the circuit A providing a DC voltage source in series between the positive node 114 of the DC power source 102 and the measurement input node 116 of the diagnostic system 106. The output of the circuit A, present at the output node A2 (i.e., voltage V2), has essentially the same AC components present in the voltage V1, but has a significantly lower DC voltage. For example, the DC component of the voltage V2 may be less than 60 V (e.g., 20 V, 30 V, 40 V), whereas the DC component of the voltage V1 may be greater than 300 V (e.g., 500 V, 800 V). In contrast, the circuit A may have substantially no effect on the magnitude or phase (e.g., 0-15% effect on magnitude, 0-3 degrees effect on phase) of the AC component of the voltage V1.

Since the circuit A reduces the voltage V1 specifically for the measurement by the diagnostic system 106, the current passing through the circuit A is small compared to the current passing through the DC system load 104. Thus, the circuit A may be supplied with power either independently or directly from the DC power source 102 via a node X, which electrically couples the node A3 of the circuit A to the ground reference 120. As discussed further below, the zero- or constant-phase property of the circuit A should hold for the range of frequencies required by the diagnostic system 106 (e.g., 0.01 Hz to 2 KHz, 0.01 Hz to 5 KHz, 0.01 Hz to 10 KHz).

The circuit B operates to reduce the voltage from the voltage V1 to the voltage V3 without affecting the phase element, or shifting the phase by a constant value, and/or without affecting the amplitude of the AC component of the diagnostic signal. In contrast to the circuit A, the circuit B may alter the amplitude of the AC component of the voltage V1 to provide the voltage V3, when the diagnostic signal is current. Since the two-terminal circuit B is in series with a current controlled load provided by the superimposed AC current and load generator 108 of the diagnostic system 106, a resistive component may be used. To ensure a low-voltage at the node B2, even when the diagnostic system 106 is disconnected, the resistive component may be coupled with a constant current source, for example, the resistive component may be coupled to the ground reference 120 via a node Y.

Figure 5:
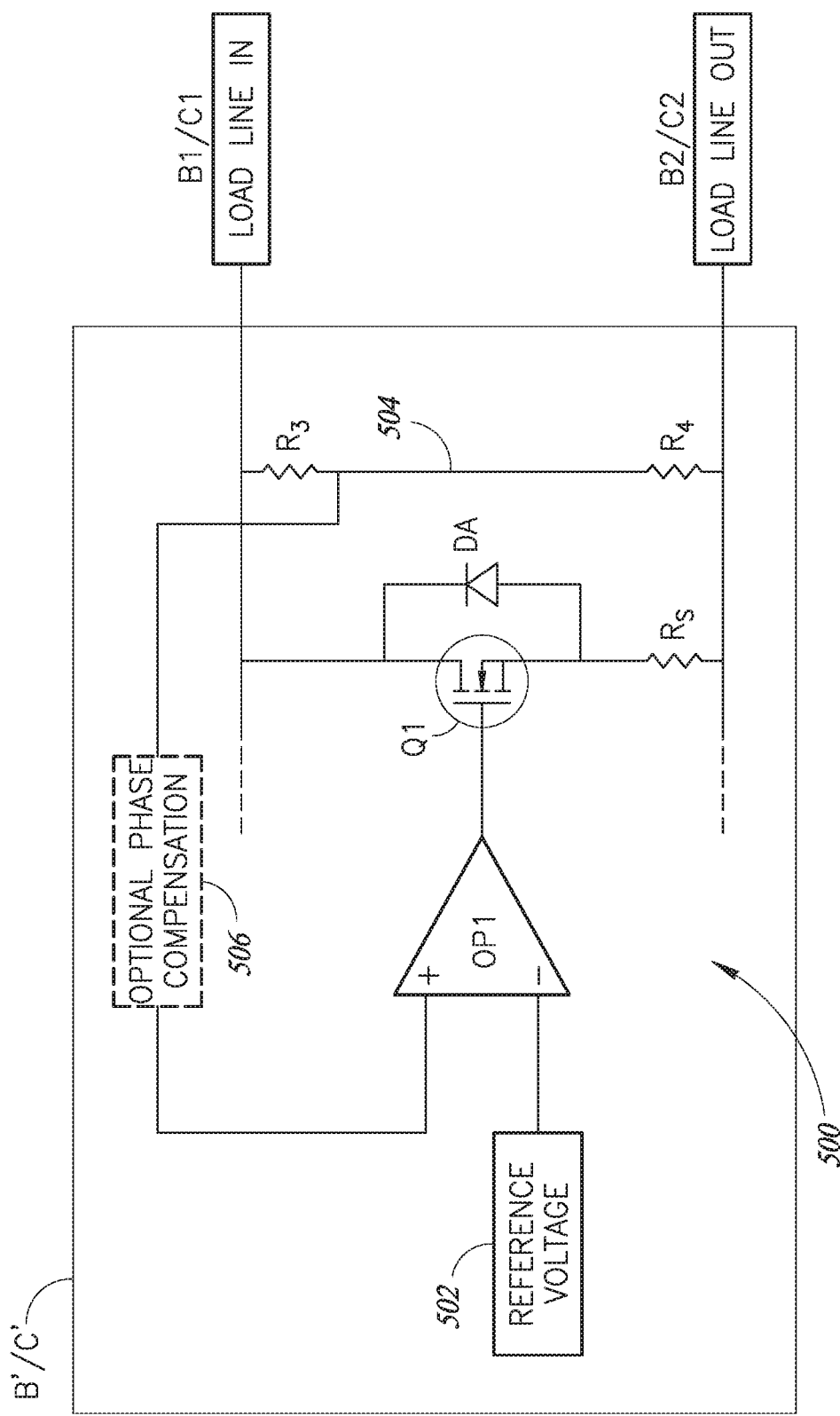
FIG. 5 is a schematic diagram of a voltage reducing circuit of a low voltage interface, according to one illustrated implementation.

For a wider range of load currents, a controlled voltage source or a constant voltage load bank may be used (see, e.g., FIG. 5). In some implementations, a controlled voltage source or a load bank may be a two node circuit (e.g., nodes B1 and B2). In some implementations, the circuit B may optionally utilize the electrical ground reference 120 via a node Y.

An optional low-pass filter (LPF) 105 may be included for switched-type system loads 104 (e.g., DC-to-DC converters or inverters).

In the implementation shown in FIG. 1, since the system load 104 is used during measurement, most of the DC power is handled by this load and not the diagnostic system 106, which allows for a relatively smaller diagnostic system to be used.

It is noted that, if the system load 104 is of switched type, the AC current leakage from these types of loads can affect the accuracy of the measurement. This, however, is not an issue concerning the reduced-voltage EIS/AC analysis techniques of the present disclosure, but the nature of the measurement itself. While the frequency at which these switched type loads work is usually higher than the frequency of measurement containing fuel cell stack health data, the presence of unwanted AC components may still affect the measurement. In some implementations, such can be mitigated by proper filtering of the load through the LPF 105 in FIG. 1, and/or by use of a wider measurement window and use of an average or median of the window as a data point.

Figure 11:
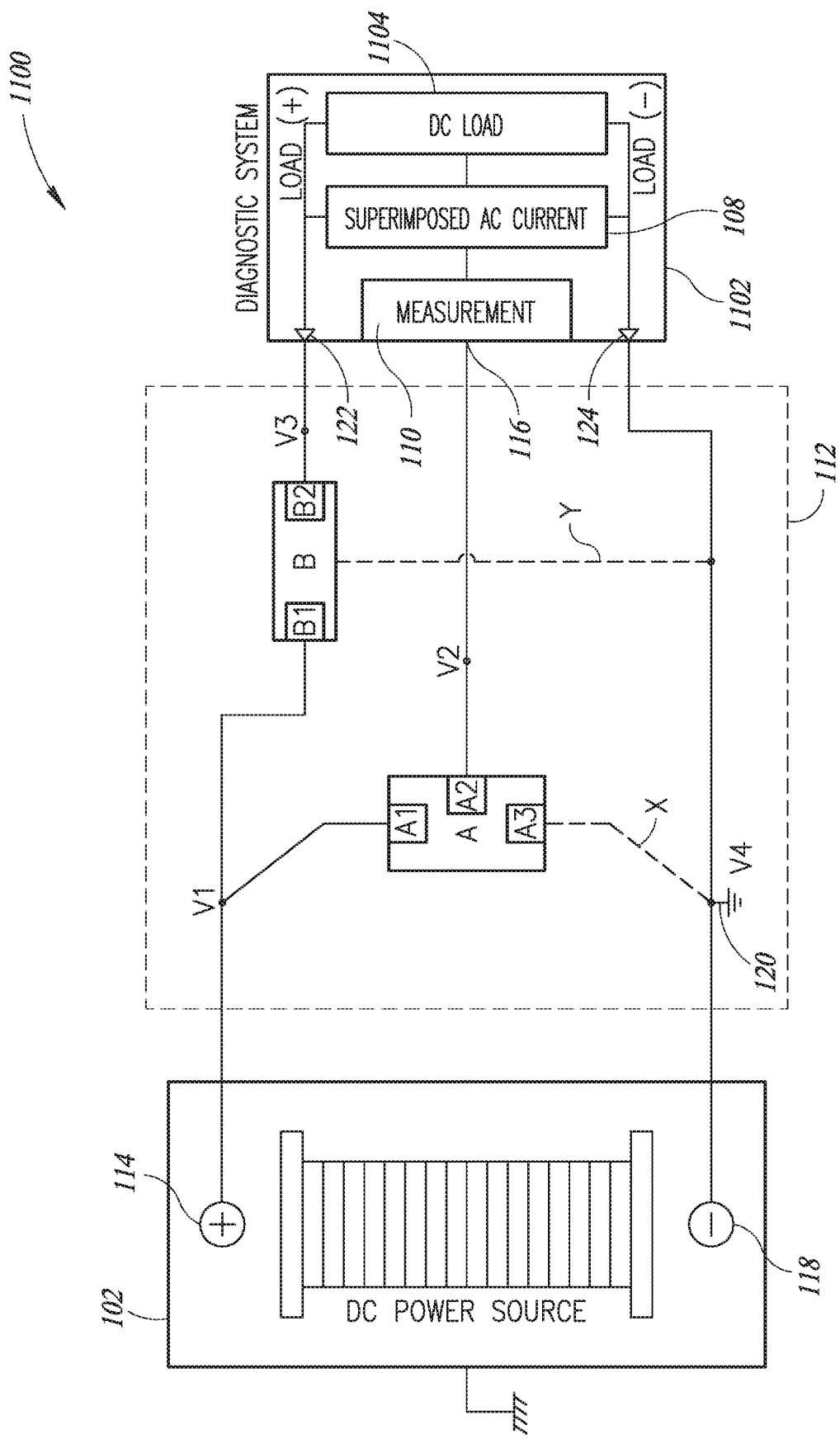
FIG. 11 is a schematic diagram of a diagnostic test setup which includes a low voltage interface coupled between a DC power source and a diagnostic system, according to one illustrated implementation.

In some implementations, such as testing implementations, the systems and methods disclosed herein may be used to improve existing test equipment by increasing their voltage capabilities or by permitting lower-voltage diagnostic equipment to be used on higher-voltage stacks. For example, FIG. 11 shows a schematic diagram of a diagnostic test setup 1100 which includes the low voltage interface 112 coupled between the DC power source 102 and a diagnostic system 1102. In this implementation, the diagnostic system 1102 includes a DC load unit 1104. For a narrow range of load currents, the circuit B of the low voltage interface 112 may be implemented using resistors, for example, non-inductive resistors. For a wider range of load currents, a controlled voltage source or a constant voltage load bank may be used (see, e.g., FIG. 5). It should be appreciated that the diagnostic system 1102 of FIG. 11 may also be used with a single zero- or constant-phase, DC-only voltage reducing circuit C shown in FIG. 2 and discussed below.

Figure 2:
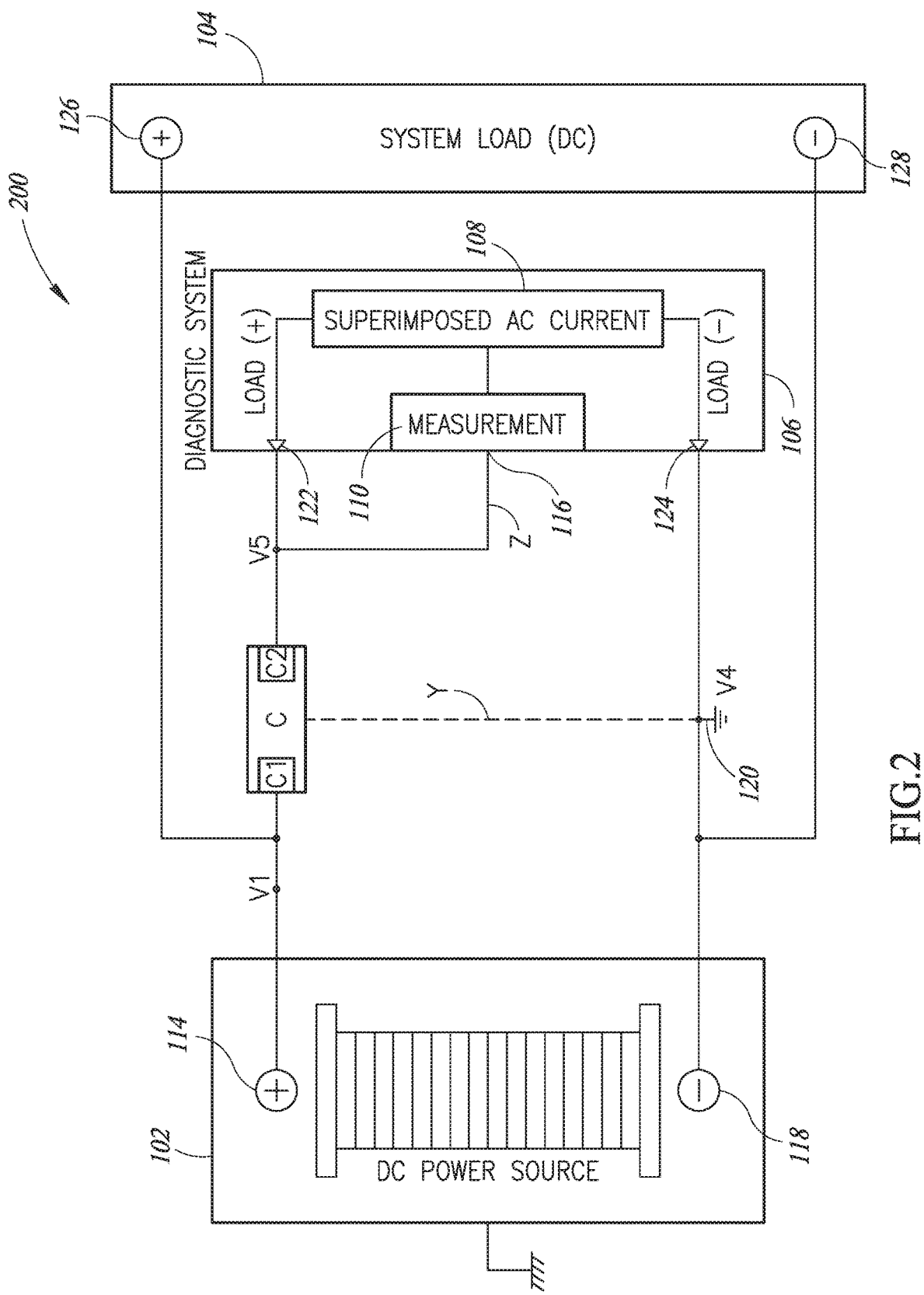
FIG. 2 is a schematic diagram of a DC powered device which includes a low voltage interface coupled between a DC power source and a diagnostic system, according to one illustrated implementation.

FIG. 2 shows a schematic diagram of various components for another implementation of a DC powered device 200. The DC powered device 200 is similar to the DC powered device 100 of FIG. 1 in many respects, so a discussion of similar or identical components is not provided for the sake of brevity.

In the implementation shown in FIG. 2, the circuits A and B are replaced by a single zero-phase, DC-only voltage reducing circuit C. The circuit C includes an input node C1 electrically coupled to the positive node 114 of the DC power source 102 and an output node C2 electrically coupled to the positive node 122 of the diagnostic system 106 and to the measurement input node 116 of the diagnostic system. The circuit C may include a constant-voltage load bank or voltage source, similar to the circuit B of FIG. 1. The output node C2 of the circuit C, which has a voltage V5, has the same AC components present in the voltage V1, but has a significantly lower DC voltage component (e.g., 50 V vs. 300 V). In some implementations, a controlled voltage source or a load bank may be a two node circuit (e.g., nodes C1 and C2). In some implementations, the circuit C may optionally utilize the electrical ground reference 120 via a node Y.

Since a measurement signal Z is fed to the measurement input node 116 of the diagnostic system 106 directly from the reduced-voltage side of the load line (i.e., voltage V5), the circuit C should satisfy the zero-phase shifting property for the range of frequencies required by the diagnostic system 106, and at the desired load. For example, the diagnostic system 106 may require a range of frequencies between 0.01 Hz and 2 KHz, between 0.01 Hz and 5 KHz, etc.

It is noted that the implementation of FIG. 1 discussed above has the flexibility of using only the low-power circuit A when the load is of little or no concern for the measurement. Further, the high-current circuit B does not require having an equivalent resistance of almost zero, and therefore can be implemented using non-inductive resistors, allowing a cost-efficient and simple solution. Further, even if it is desired to use a controlled voltage source or a constant-voltage load bank instead of non-inductive resistors, the equivalent resistance of these units is not of concern. Generally, it is only important that the equivalent series reactance of the circuit remains zero or substantially zero. The design of such circuits is simpler and more versatile for a wide range of loads. In the implementation of FIG. 2, using a single circuit (i.e., the circuit C) for both the load and measurement signals provides unified solution and smaller footprint, and simplifies the wiring.

Figure 3:
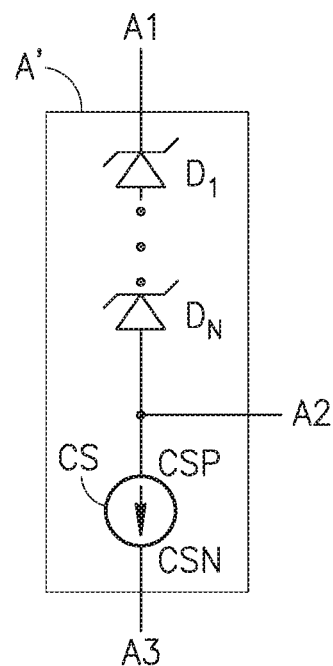
FIG. 3 is a schematic diagram of a DC-only voltage reducing circuit of a low voltage interface which includes a plurality of series-connected Zener diodes, according to one illustrated implementation.

FIG. 3 shows a circuit A' which may be implemented to achieve the operation of the circuit A of FIG. 1. Like the circuit A of FIG. 1, the circuit A' includes nodes A1, A2 and A3. The circuit A' comprises a number of Zener diodes $D_1$-$D_N$ coupled in series with a high impedance and/or zeroor constant-phase current source CS which biases the Zener diodes. The current source CS includes a first node CSP coupled to the node A2 and a second node CSN coupled to the node A3.

The Zener diodes $D_1$-$D_N$ receive the voltage V1 (FIG. 1) and drop only the DC component of the voltage V1 to the output node A2 of the circuit A', which is fed to the measurement input node 116 of the diagnostic system 106 as shown in FIG. 1. The high impedance current source CS biases the Zener diodes $D_1$-$D_N$ so that the DC voltage drop across the Zener diodes is substantially constant. In practice, the number of Zener diodes $D_1$-$D_N$ may be selected to achieve a desired DC voltage drop. For example, the number of Zener diodes used may be 1, 3, 10, 20, etc., dependent on the amount of DC voltage reduction desired and the amount of voltage reduction provided by each of the Zener diodes. The current provided by the current source CS may be dependent on the particular type and number of Zener diodes used in the circuit A'. In some implementations, the current source CS provides a current having a magnitude between 5 mA and 100 mA.

The Zener diodes $D_1$-$D_N$ may be any suitable Zener diodes. Generally, Zener diodes with a Zener voltage that is lower than 5.6 V use predominantly electron quantum tunneling mechanism and tend to have less than "ideal" Zener behavior. This means comparatively higher internal resistance during conduction, which degrades the overall system response. Zener diodes with a very high Zener voltage (e.g., above 30 V) have much higher temperature coefficient. This affects the amount of voltage reduced and could cause problems in cases with narrow voltage margins. Moreover, it is easier to compensate for temperature coefficient at lower voltage diodes since avalanche mechanism and electron quantum tunneling mechanism are both in effect and have opposite temperature coefficient effect on the device. The former could affect the functionality of the voltage reduction circuitry, but the latter does not affect the functionality of the circuit.

In general, if the equivalent AC resistance of the diode during conduction is high, it could degrade the performance. This depends not only on voltage range but manufacturing process.

Figure 4:
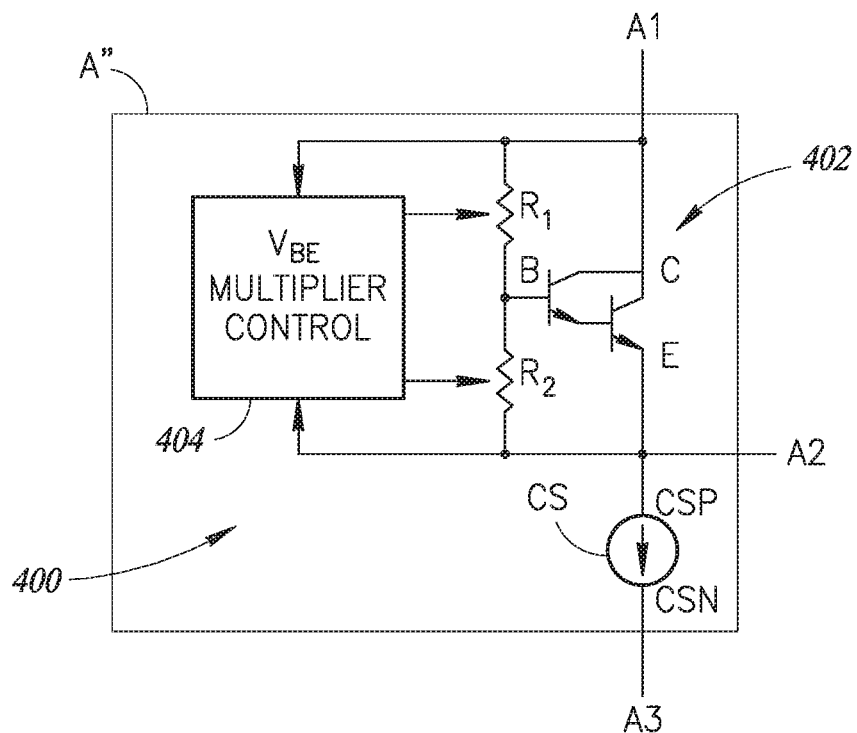
FIG. 4 is a schematic diagram of a DC-only voltage reducing circuit of a low voltage interface which includes a $V_{BE}$ multiplier circuit, according to one illustrated implementation.

FIG. 4 shows a circuit A" which may be implemented to achieve the operation of the circuit A of FIG. 1. The circuit A" includes nodes A1, A2 and A3 which correspond to the nodes A1, A2 and A3 of the circuit A of FIG. 1. The circuit A" includes a $V_{BE}$ multiplier circuit 400 coupled in series with the zero-phase, high impedance current source CS also shown in FIG. 3. The $V_{BE}$ multiplier circuit 400 comprises a pair of resistors $R_1$ and $R_2$ and a transistor 402. The transistor 402 is a compound structure which includes two bipolar transistors (either integrated or separated devices) connected together such that the current amplified by the first transistor is further amplified by the second transistor, which provides a much higher common/emitter current gain than each transistor taken separately. In at least some implementations, the transistor 402 is a Darlington transistor. In some implementations, a $V_{BE}$ multiplier circuit may be implemented using one or more transistors rather than the transistor 402 shown in FIG. 4. In order to increase the voltage handling capability of the circuit, the $V_{BE}$ multiplier may be arranged in a cascode configuration by stacking two or more transistors biased by a network of three or more resistors connected in series. Similarly, a VGS multiplier can be implemented, whereby transistor 402 is a metal-oxide-semiconductor-field-effect transistor (MOSFET).

The resistors $R_1$ and $R_2$ are electrically coupled in series to form a voltage divider which sets a voltage for the base B of the transistor 402. The output voltage $V_{BE}$ of the voltage divider may be expressed as:

$$V_{BE} = (R_2/R_1+R_2) * V_{CE}$$

Since the voltage $V_{BE}$ is determined by the forward voltage of the base-emitter junction of the transistor 402, the voltage $V_{CE}$ adjusts to satisfy the following relationship:

$$V_{CE} = ((R_1+R_2)/R_2) * V_{BE}$$

Thus, the forward voltage drop of the $V_{BE}$ multiplier circuit 400, which is the voltage $V_{CE}$, is a multiple of the $V_{BE}$ voltage. The ratio of the values of the resistors $R_1$ and $R_2$ may be selected to obtain a desired value for the voltage $V_{CE}$. In some implementations, the two resistors $R_1$ and $R_2$ may be implemented as one or more variable potential dividers ("trimmers") controllable by a $V_{BE}$ multiplier controller 404 so that the voltage drop provided by the $V_{BE}$ multiplier circuit may be adjusted to provide a desired DC voltage drop. In such implementations, the variable potential divider may be controlled to provide a selected DC voltage level at the node A2 of the circuit A".

In practice, the circuit A" of FIG. 4 may be advantageous over the circuit A' of FIG. 3 in some aspects. For example, the $V_{BE}$ multiplier circuit 400 maintains an almost constant forward voltage drop as its current is changed because the voltage $V_{CE}$ is proportional to the voltage $V_{BE}$, and the voltage $V_{BE}$ changes only slightly with current. Further, the $V_{BE}$ multiplier circuit 400 may be compensated for the temperature coefficient of the transistor as well as the Early effect in large-signal characteristic.

As non-limiting examples, in some implementations the resistor $R_1$ may have a value of 8.5 kΩ and the resistor $R_2$ may have a value of 120Ω, dependent on the desired voltage drop. The transistor 402 may be a model 2SD2390 transistor, for example. The rating of the transistor 402 may be determined by the desired voltage drop and the current passing through the circuit. Voltage is determined by the voltage rating of the system. As for current, generally, the higher the collector-emitter current, the lower the AC impedance of the $V_{BE}$ multiplier, which is preferred. However, by increasing the current, the internal impedance of the current source could become lower, which is undesirable. Therefore, this trade-off needs to be taken into account. It is noted that the AC impedance of a current source with strong negative feedback (i.e. the current source 1000 of FIG. 10) is less affected by increase in current. The gain of the transistor 402 is also important, with higher gain producing better "ideal," Zener-like behavior for the multiplier. A MOSFET may also be used but, due to lower transconductance, a bipolar junction transistor (BJT) may be preferred.

FIG. 5 shows a circuit B'/C' which may be implemented to achieve the operation of either of the circuits B and C of FIGS. 1 and 2, respectively. The circuit B'/C' includes a pass element, in the form of a MOSFET $Q_1$, coupled in antiparallel with diode DA across the load line in node B1/C1 (see FIGS. 1 and 2) and the load line out node B2/C2. The circuit B'/C' includes a control element 500 comprising an operational amplifier OP1, a reference voltage source 502, and feedback resistors $R_3$ and $R_4$ which vary the resistance of the MOSFET $Q_1$ so that the voltage drop from the load line in node B1/C1 to the load line out node B2/C2 remains constant regardless of the input voltage and the load. The output of the reference voltage source 502 is electrically coupled to an inverting node of the operational amplifier OP1, and an output node 504 of the feedback resistors $R_3$ and $R_4$ is electrically coupled to the positive node of the operational amplifier. The output node of the operational amplifier OP1 is electrically coupled to the gate node of the MOSFET $Q_1$.

The circuit B'/C' may be operated using the voltage of the DC power source 102 (FIG. 1) itself, or may use an independent power supply for eliminating possible interference. Further, instead of the MOSFET $Q_1$, the pass element may be selected from high-gain or Darlington BJTs, insulated-gate bipolar transistor (IGBTs), or other suitable components. Due to high dissipating power in the circuit B'/C', multiple pass elements (e.g., multiple MOSFETs) maybe coupled in parallel, each with a dedicated source/emitter resistance $R_S$, to increase the power handling capability of the circuit. The anti-parallel diode DA may be omitted for transistors which have a diode in the body (e.g., MOSFETs, some Darlington BJTs, most IGBTs). In some implementations, the feedback network resistors $R_4$ may be omitted and $R_3$ shorted if the voltage drop across the pass element (e.g., MOSFET $Q_1$) is in the operating region of the operation amplifier OP1.

The circuit B'/C' may also include optional phase compensation circuitry 506 as shown in FIG. 5. The phase compensation circuitry 506 may be implemented passively or actively by introducing one or more poles to the feedback circuitry.

In some implementations, the transistor $Q_1$ may be a MOSFET (e.g., model IRFP250) or a BJT (e.g., MJL3281). The voltage rating may be determined by the system voltage, and the current rating may be determined by the load (including the AC superimposed current), both with a safety margin. The higher the gain (or transconductance), the lower (theoretically) the AC impedance of the system.

In some implementations, the resistor $R_S$ may have a value of 0.01Ω, and may be a non-inductive type resistor. The resistor $R_3$ may have a value of 82KΩ, and the resistor $R_4$ may have a value of 1 kΩ, for example. Generally, a lower temperature coefficient for the resistors $R_3$ and $R_4$ is preferred. If phase compensation is used, the resistors $R_3$ and $R_4$ may normally have a very low tolerance for effective compensation (e.g., 0.1% tolerance).

Figure 6:
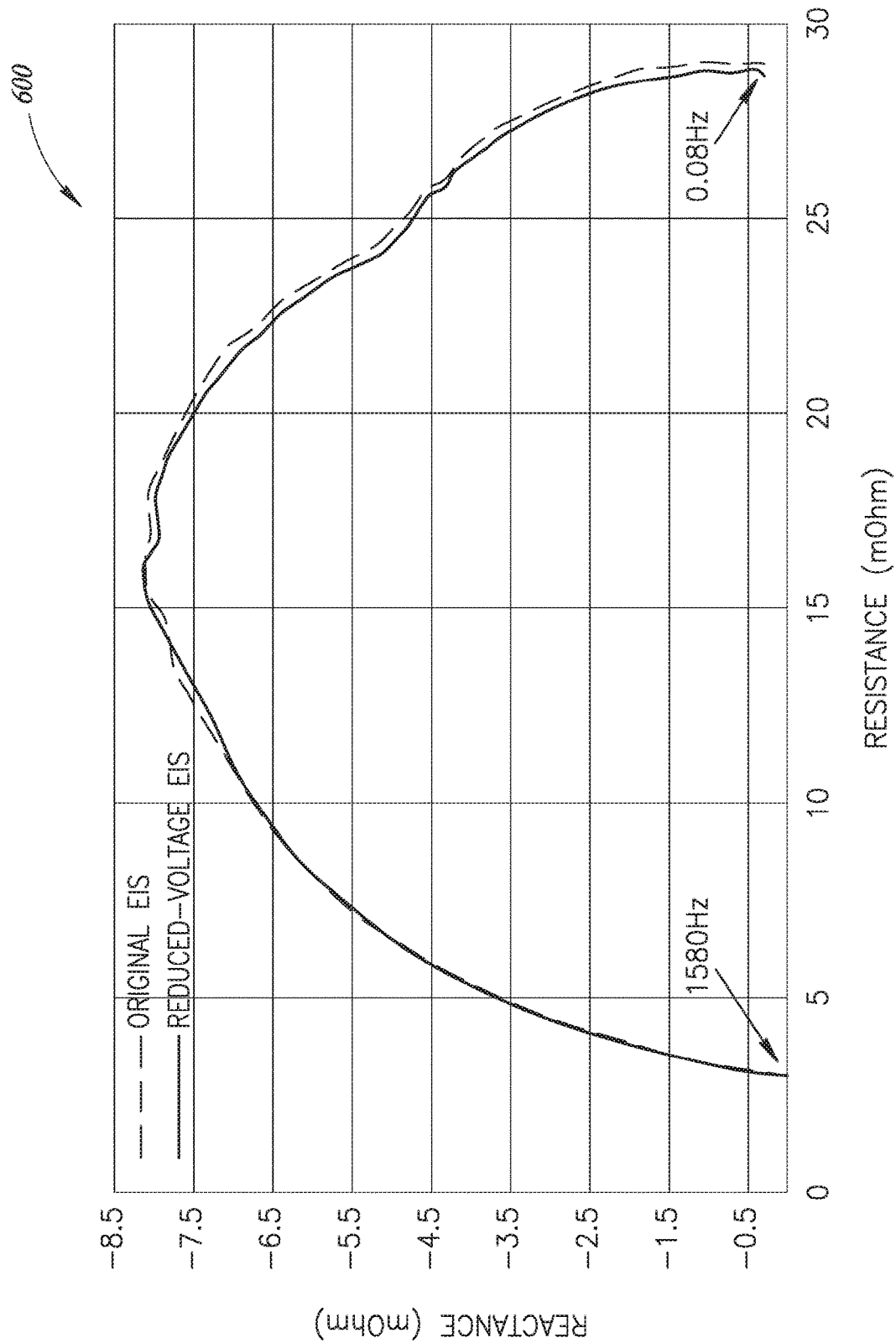
FIG. 6 is a graph showing a comparison of EIS profile signatures for reduced-voltage measurement implementations and for high voltage measurement implementations, according to one illustrated implementation.
Figure 7:
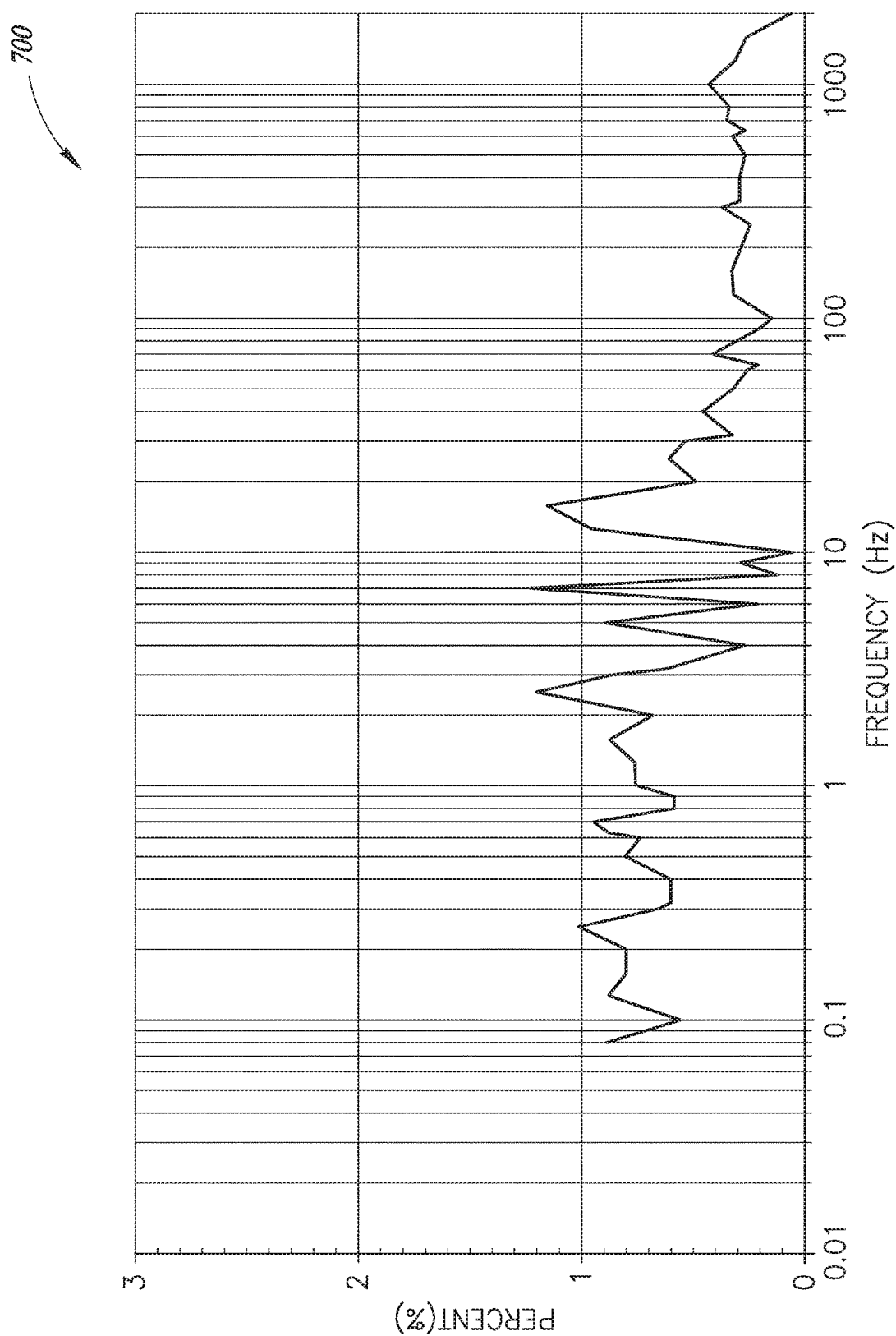
FIG. 7 is a graph showing a percentage of measurement error for the reduced-voltage measurement implementations as a function of frequency, according to one illustrated implementation.

FIG. 6 is a graph 600 showing a comparison of EIS profile signatures for reduced-voltage measurement implementations discussed herein and for high voltage measurement implementations. FIG. 7 is a graph 700 showing the percentage of measurement error for the reduced-voltage measurement implementations of the present disclosure as a function of frequency. As shown in FIGS. 6 and 7, the reduced-voltage measurements track the high voltage measurements closely.

Figure 8:
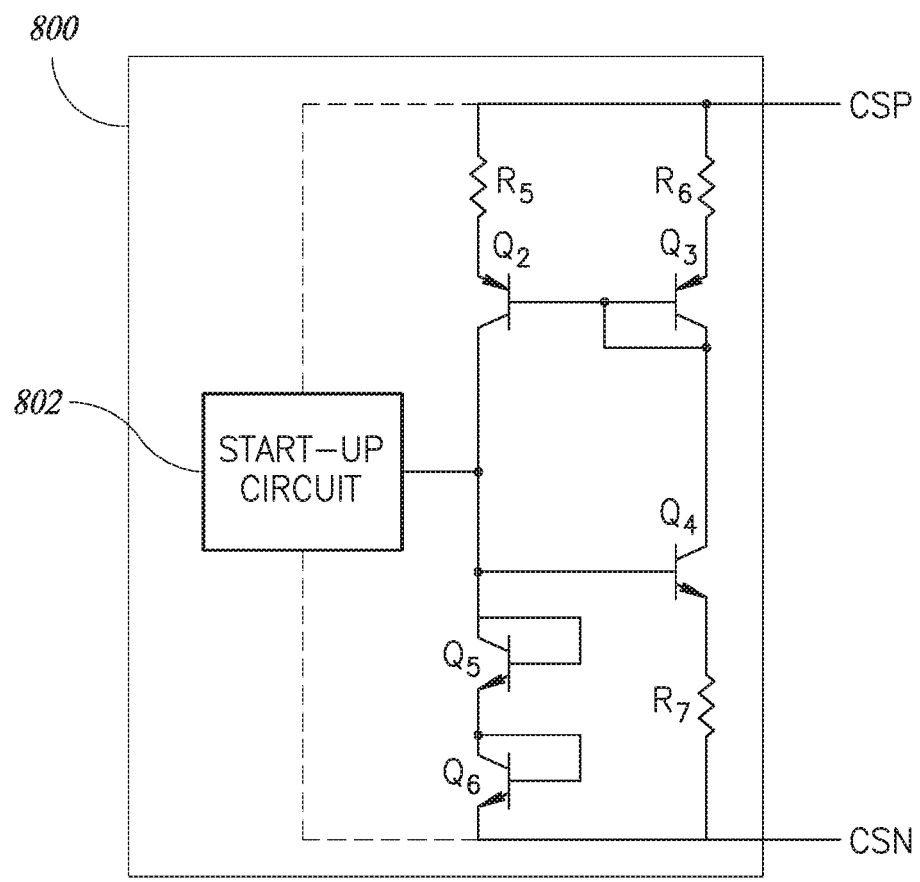
FIG. 8 is a schematic diagram of a two-terminal current source which exhibits zero-phase up to a few kilohertz, according to one illustrated implementation.
Figure 9:
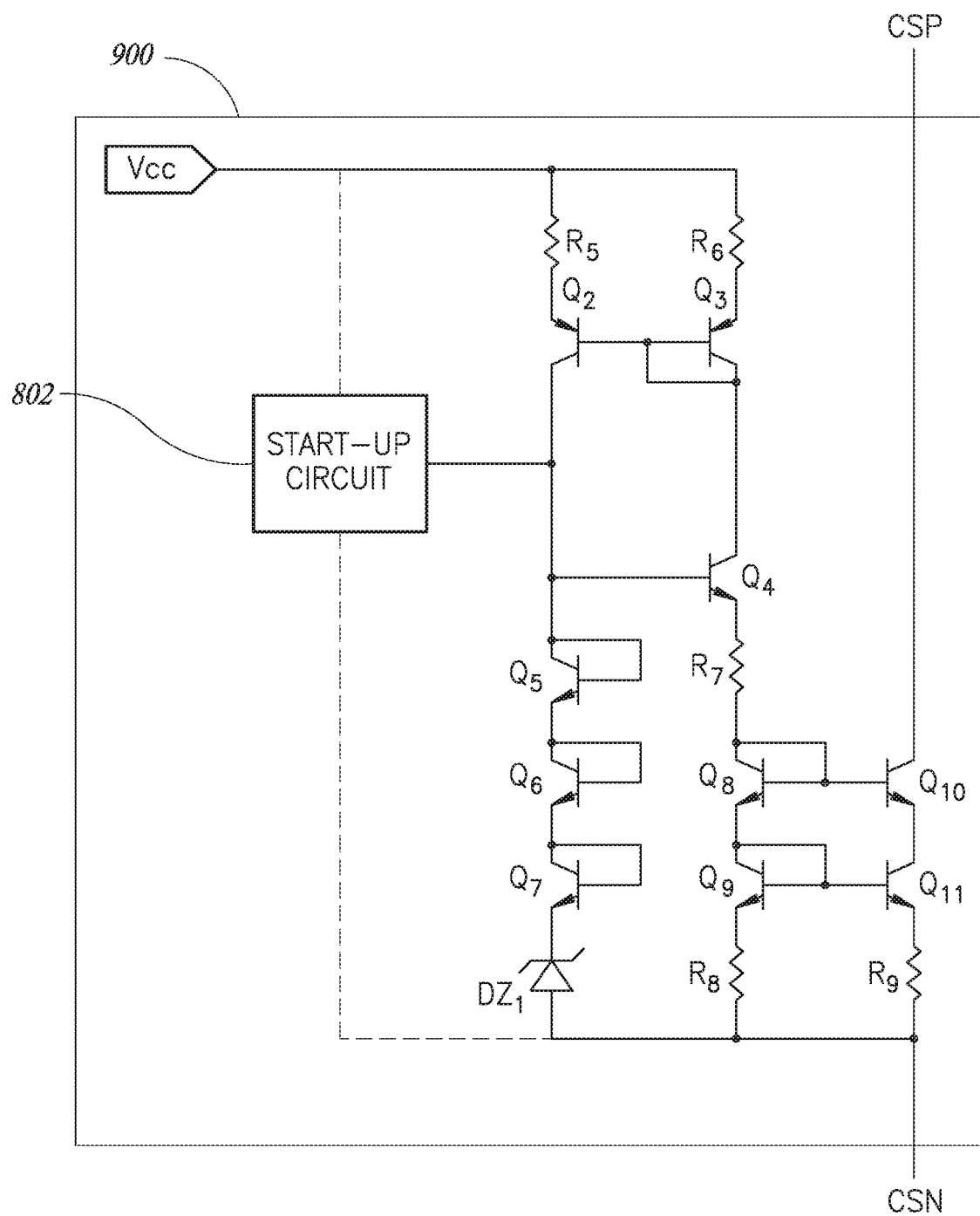
FIG. 9 is a schematic diagram of a high impedance current source which exhibits zero-phase up to a few kilohertz, according to one illustrated implementation.
Figure 10:
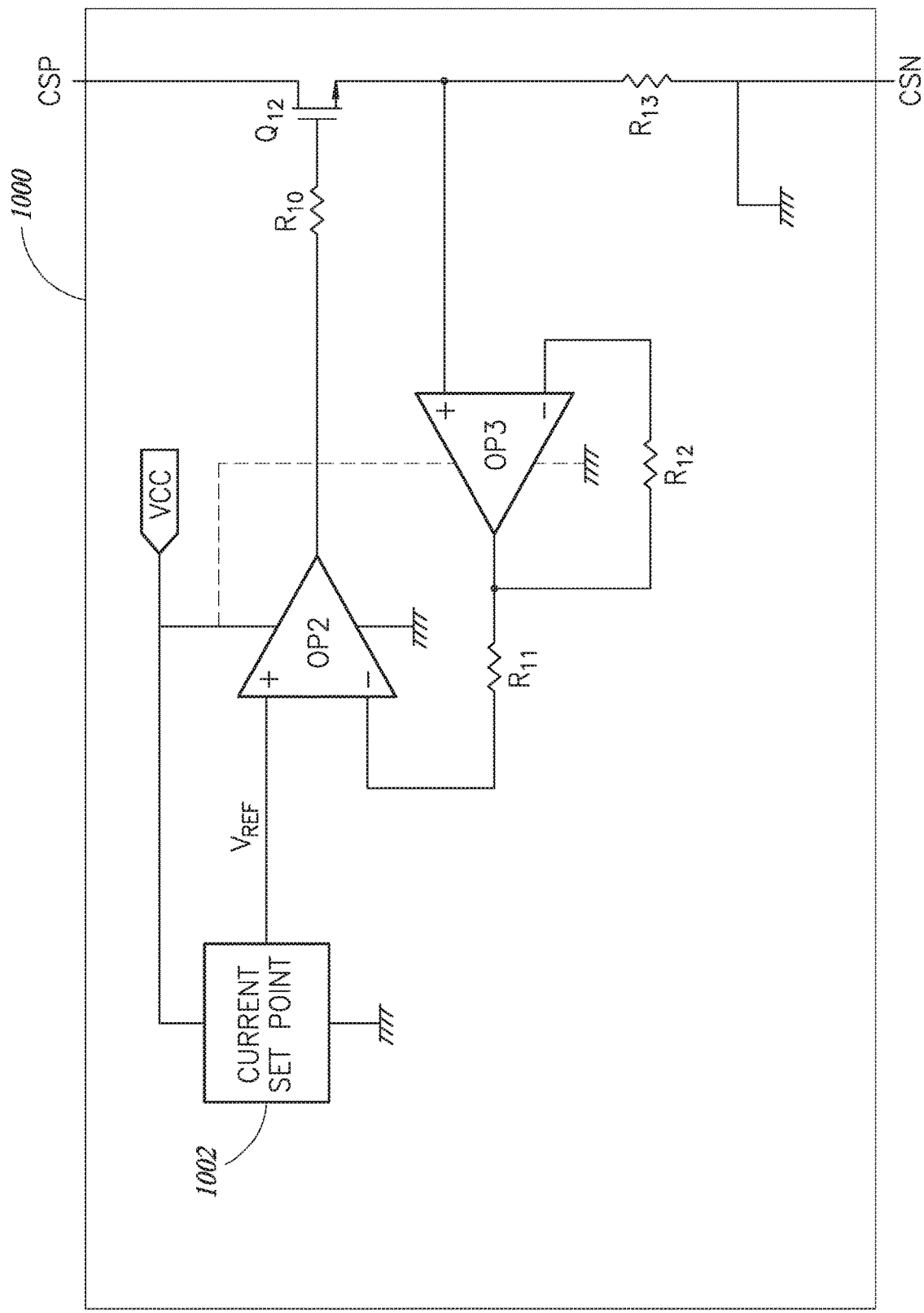
FIG. 10 is a schematic diagram of a current source which includes active phase compensation, according to one illustrated implementation.

FIGS. 8, 9 and 10 show schematic diagrams for three current sources 800, 900 and 1000, respectively, which may be used to implement the zero-phase and/or high impedance current source CS shown in FIGS. 3 and 4.

Referring first to FIG. 8, the current source 800 is a two node device having a node CSP and a node CSN, which correspond to the nodes CSP and CSN, respectively, of the current source CS of FIGS. 3 and 4. The current source 800 comprises a plurality of discrete BJT transistors $Q_2$-$Q_6$ and a plurality of resistors $R_5$-$R_7$.

The transistors $Q_4$, $Q_5$ and $Q_6$ and the resistor $R_7$ together establish a supply-independent current for $Q_4$. The transistors $Q_2$ and $Q_3$ and the resistors $R_5$ and $R_6$ form a current mirror which mirrors the current flowing through the transistor $Q_4$, and then feed the current back again to the circuit through the transistors $Q_2$, $Q_5$ and $Q_6$. The resistors $R_5$ and $R_6$ may be identical and provide negative feedback which minimizes any discrepancy between the $V_{BE}$ profiles of the transistors $Q_2$ and $Q_3$.

A start-up circuit block 802 is utilized to start the current source 800, since at the time the current source is started there is no current initially going through the transistor $Q_4$. The start-up circuit block 802 is only functional until the set current is established in the current source circuit 800.

As non-limiting examples, the transistors $Q_2$ and $Q_3$ may be model 2SA1667 transistors, the transistor $Q_4$ may be a model 2SC4381 transistor, and the transistors $Q_5$ and $Q_6$ may be model 2SC3902 transistors. The resistors $R_5$ and $R_6$ may have a value of 33Ω and the resistor $R_7$ may have a value of 56Ω, for example.

The current source 900 of FIG. 9 is similar to the current source 800 of FIG. 8 in many respects, so a discussion of the identical components between the two current sources is not provided for the sake of brevity. The current source 900 has a greater impedance than the current source 800. For example, the current source 900 may have an impedance which is 10 to 100 times greater than the impedance of the current source 800.

In addition to the components of the current source 800, the current source 900 also includes transistors $Q_7$-$Q_{11}$ and resistors $R_8$ and $R_9$. The transistor $Q_4$ is the main transistor which, along with transistors $Q_5$-$Q_7$ and the Zener diode $DZ_1$, establishes current through the resistors $R_7$ and $R_8$. The resistors $R_8$ and $R_9$ may be identical. Alternatively, the resistors $R_8$ and $R_9$ may have different resistances from each other if it is desirable to have multiplication of current at the output.

As shown in FIG. 9, the current source 900 includes a leg comprising the transistors $Q_5$-$Q_7$ and the Zener diode $DZ_1$. A first one of the three transistors $Q_5$, $Q_6$, and $Q_7$ compensates for the voltage $V_{BE}$ of the transistor $Q_4$. The transistors $Q_6$ and $Q_7$ compensate for the voltage $V_{BE}$ of the transistors $Q_8$ and $Q_9$. The Zener diode $DZ_1$, $R_7$, and $R_8$ are used to establish the current. Thus, the current through the transistor $Q_4$ is equal to the voltage of $DZ_1$ divided by the sum of the resistors $R_7$ and $R_8$.

The transistors $Q_8$-$Q_{11}$ form a current mirror in the cascode configuration which increases the output impedance of the current source 900.

As shown in FIG. 9, the current source 900 requires an additional voltage supply $V_{CC}$ to operate, which is in contrast to the two node current source 800 of FIG. 8. The voltage supply $V_{CC}$ may be obtained directly from the DC power source 102 (FIG. 1) or may be obtained from a separate power source. In some implementations, the voltage supply $V_{CC}$ is set between 12-24V, for example.

As non-limiting examples, the transistors $Q_2$ and $Q_3$ may be model 2SA1667 transistors, the transistors $Q_4$ and $Q_8$-$Q_{11}$ may be model 2SC4381 transistors, and the transistors $Q_5$-$Q_7$ may be model 2SC3902 transistors. The Zener diode $DZ_1$ may have a Zener voltage of 6.8 V, for example. The resistors $R_5$ and $R_6$ may have a value of 33Ω, the resistor $R_7$ may have a value of 270Ω, and the resistors $R_8$ and $R_9$ may have a value of 10Ω, for example.

Advantageously, the circuits 800 and 900 are compensated against temperature drift and are independent of the supply voltage.

FIG. 10 shows the current source 1000 which is an adjustable current source having active phase compensation. The current source 1000 includes a control operational amplifier OP2 and an optional feedback operational amplifier OP3 (e.g., model LT1632). The current source 1000 also includes a MOSFET $Q_{12}$, resistors $R_{10}$-$R_{13}$, and a current set point block 1002. As non-limiting examples, the MOSFET $Q_{12}$ may be a model IRF610, a MOSFET-N transistor. The transistor $Q_{12}$ may also be replaced with a BJT transistor (e.g., model FJAF4310) or a BJT Darlington transistor (e.g., model 2SD2390). The resistor $R_{10}$ may be 100Ω, the resistors $R_{11}$ and $R_{12}$ may be 10 kΩ, and the resistor $R_{13}$ may be 10Ω, for example. The resistors $R_{11}$ and $R_{12}$ may have a low tolerance (e.g., 0.1% or better), and the resistor $R_{13}$ may be non-inductive. The current source 1000 includes a node CSP and a node CSN, which correspond to the nodes CSP and CSN, respectively, of the current source CS of FIGS. 3 and 4.

The control operational amplifier OP2 operates to control the transistor $Q_{12}$ through the resistor $R_{10}$, which is provided to improve the stability of the circuit against the capacitive load of the gate of the transistor $Q_{12}$. Feedback for the current passing through the transistor $Q_{12}$ is provided by the resistor $R_{13}$, which senses the current, and sends the feedback to the inverting input of the operational amplifier OP2 via the operational amplifier OP3. In some implementations, the transistor $Q_{12}$ may be replaced with a high-gain or Darlington BJT.

The current set point block 1002 provides a reference voltage $V_{ref}$ to the noninverting input of the operational amplifier OP2. The operational amplifier OP2 controls the output current passing through $Q_{12}$ to achieve a sense voltage across $R_{13}$ equal to the set point reference voltage $V_{ref}$. In other words, the output current is equal to the reference voltage $V_{ref}$ divided by the resistor $R_{13}$.

The feedback operational amplifier OP3 and its associated circuitry (i.e., resistors $R_{11}$ and $R_{12}$) provide active phase compensation for the current source 1000. In particular, the operational amplifier OP3 functions to cancel the poles of the control operational amplifier OP2.

In some implementations, the operational amplifiers OP2 and OP3 are formed from the same wafer in the same package (e.g., monolithic dual operational amplifier package, such as model LT1632), such that their physical characteristics are nearly identical. In such instances, the zeros of the operational amplifier OP2 and the zeros of the operational amplifier OP3 are nearly identical. Likewise, the poles of the operational amplifier OP2 and the poles of the operational amplifier OP3 are also nearly identical. Thus, the operational amplifier OP3 may be configured such that the poles of the control operational amplifier OP2 are canceled, and the zero-phase property of the current source 1000 may be extended into relatively higher frequencies (e.g., 5 kHz, 10 kHz), which may be desirable for certain measurements.

In some implementations, the current source 1000 may utilize passive phase compensation instead of active phase compensation. In some implementations, the current source 1000 may utilize active compensation circuitry similar or identical to that described in Soliman A. M and Ismail M., *Active Compensation of Op Amps*, IEEE Transactions Circuits and Systems, 26, 1979, 112-117.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and non-patent publications referred to in this specification, including U.S. Provisional Patent Application Ser. No. 61/941,927, filed Feb. 19, 2014, International Patent Application No. PCT/US2015/016698, filed Feb. 19, 2015, and U.S. Provisional Patent Application Ser. No. 62/194,073, filed Jul. 17, 2015 are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A low voltage interface which in use couples a direct current (DC) power source to an alternating current (AC) signal diagnostic system, the DC power source comprises a positive node, the AC signal diagnostic system comprises a diagnostic signal output node which applies an AC signal to the DC power source, the AC signal diagnostic system further comprises a measurement input node, the low voltage interface comprising:

an interface input node electrically coupleable to the positive node of the DC power source;

a first interface output node electrically coupleable to the measurement input node of the AC signal diagnostic system; and a voltage-reduction circuit electrically coupled to the interface input node and the first interface output node, the voltage-reduction circuit:

receives an input voltage from the DC power source via the interface input node, the input voltage comprising a DC component and an AC component;

reduces the DC component of the input voltage without substantially affecting a magnitude or phase of the AC component of the input voltage, or reduces the DC component of the input voltage with a constant amplification or a constant phase shift of the AC component of the input voltage, which provides a measurement voltage including, a reduced DC component; and provides the measurement voltage to the measurement input node of the AC signal diagnostic system via the first interface output node.

2. The low voltage interface of claim 1 wherein the voltage-reduction circuit comprises a DC voltage source electrically coupled in series between the interface input node and the first interface output node, and maintains a zero or constant phase between the interface input node and the first interface output node.

3. The low voltage interface of claim 1 wherein the voltage-reduction circuit reduces the DC component of the input voltage without substantially affecting the magnitude or phase of the AC component of the input voltage, or reduces the DC component of the input voltage with a constant amplification or phase shift of the AC component of the input voltage, for AC signals having a frequency between 0.01 Hz and 5000 Hz.

4. The low voltage interface of claim 1 wherein the voltage-reduction circuit comprises at least one resistor electrically coupled in series with a biasing current source.

5. The low voltage interface of claim 1 wherein the voltage-reduction circuit comprises at least one Zener diode electrically coupled in series with a biasing current source.

6. The low voltage interface of claim 1 wherein the voltage-reduction circuit comprises a $V_{BE}$ multiplier circuit electrically coupled in series with a biasing current source.

7. The low voltage interface of claim 6 wherein the biasing current source provides a zero- or constant-phase current response with respect to the output voltage.

8. The low voltage interface of claim 1 wherein the voltage-reduction circuit comprises one of at least one resistor electrically coupled in series with a biasing current source, at least one Zener diode electrically coupled in series with a biasing current source, and a $V_{BE}$ multiplier circuit electrically coupled in series with a biasing current source, the biasing current source having an input impedance which is at least 10 times greater than the impedance of the at least one resistor, or the at least one Zener diode, or the $V_{BE}$ multiplier circuit.

9. The low voltage interface of claim 1 wherein the voltage-reduction circuit reduces the DC component of the input voltage to a voltage of less than 60 volts.

10. The low voltage interface of claim 1 wherein the first interface output node is electrically coupleable to at least one of a load of the AC signal diagnostic system or a system load driven by the DC power source.

11. The low voltage interface of claim 1 wherein the voltage-reduction circuit comprises:
a second interface output node electrically coupleable to the diagnostic signal output node of the AC signal diagnostic system, wherein the voltage-reduction circuit:
reduces the DC component of the input voltage without substantially affecting the phase of the AC component of the input voltage, or reduces the DC component of the input voltage with a constant phase shift of the AC component of the input voltage, or reduces the DC component of the input voltage without substantially affecting the magnitude of the AC component of the diagnostic signal output node, which provides a reduced voltage; and
provides the reduced voltage to the diagnostic signal output node of the AC signal diagnostic system via the second interface output node.

12. The low voltage interface of claim 11 wherein the voltage-reduction circuit comprises at least one resistor electrically coupled in series between the interface input node and the second interface output node.

13. The low voltage interface of claim 11 wherein the voltage-reduction circuit comprises at least one Zener diode electrically coupled in series between the interface input node and the second interface output node.

14. The low voltage interface of claim 11 wherein the voltage-reduction circuit comprises at least one of a controlled voltage source or a constant-voltage load bank electrically coupled in series between the interface input node and the second interface output node.

15. The low voltage interface of claim 14 wherein reducing the DC component of the input voltage comprises applying the input voltage to a circuit that has a current source with a zero- or constant-phase current response with respect to the output voltage.

16. The low voltage interface of claim 14 wherein the voltage-reduction circuit comprises a controlled voltage source with at least one of active phase compensation or passive phase compensation.

17. A direct current (DC) power system, comprising:
a DC power source comprising a positive node;
alternating current (AC) signal diagnostic system comprising a diagnostic signal output node which applies an AC signal to the DC power source, the AC signal diagnostic system further comprising a measurement input node; and
a low voltage interface comprising:
an interface input node electrically coupled to the positive node of the DC power source;
a first interface output node electrically coupled to the measurement input node of the AC signal diagnostic system; and
a voltage-reduction circuit electrically coupled to the interface input node and the first interface output node, the voltage-reduction circuit:
receives an input voltage from the DC power source via the interface input node, the input voltage comprising a DC component and an AC component;
reduces the DC component of the input voltage without substantially affecting a magnitude or phase of the AC component of the input voltage, or reduces the DC component of the input voltage with a constant amplification or constant phase shift of the AC component of the input voltage, which provides a measurement voltage including a reduced DC component; and
provides the measurement voltage to the measurement input node of the AC signal diagnostic system via the first interface output node.

18. The DC power system of claim 17 wherein the DC power source comprises a fuel cell stack.

19. The DC power system of claim 17 wherein the AC signal diagnostic system comprises an electrochemical impedance spectroscopy (EIS) system.

20. A method, comprising:
receiving an input voltage at an interface input node of a low voltage interface electrically coupled to a positive node of a direct current (DC) power source, the input voltage comprising a DC component and an AC component;
reducing the DC component of the input voltage without substantially affecting a magnitude or phase of the AC component of the input voltage, or reducing the DC component of the input voltage with a constant amplification or constant phase shift of the AC component of the input voltage, to generate a measurement voltage including a reduced DC component; and providing the measurement voltage to a measurement input node of an AC signal diagnostic system via a first interface output node electrically coupled to a measurement input node of the AC signal diagnostic system, the AC signal diagnostic system comprising a diagnostic signal output node which in use applies an AC signal to the DC power source.

21. The method of claim 20 wherein reducing the DC component of the input voltage comprises applying the input voltage to a circuit that has a DC voltage source electrically coupled in series between the interface input node and the first interface output node, and maintaining zero or constant phase between the interface input node and the first interface output node.

22. The method of claim 20 wherein reducing the DC component of the input voltage comprises applying the input voltage to a circuit that has at least one resistor electrically coupled in series with the interface input node and the first interface output node.

23. The method of claim 20 wherein reducing the DC component of the input voltage comprises applying the input voltage to a circuit that has at least one Zener diode electrically coupled in series with the interface input node and the first interface output node.

24. The method of claim 20 wherein reducing the DC component of the input voltage comprises applying the input voltage to a circuit that has a $V_{BE}$ multiplier circuit electrically coupled in series with the interface input node and the first interface output node.

25. The method of claim 24 wherein reducing the DC component of the input voltage comprises applying the input voltage to a circuit that has a current source with zero- or constant-phase current response with respect to the output voltage.

26. The method of claim 20 wherein reducing the DC component of the input voltage comprises applying the input voltage to a circuit that has one of: at least one resistor electrically coupled in series with a the interface input node and the first interface output node, at least one Zener diode electrically coupled in series with the interface input node and the first interface output node, or a $V_{BE}$ multiplier circuit electrically coupled in series with the interface input node and the first interface output node, and reducing the DC component of the input voltage comprises applying the input voltage to a circuit that has a current source with zero- or constant-phase current response with respect to output voltage, or having an input impedance which is at least 10 times greater than the impedance of the at least one resistor, or at least one Zener diode, or the $V_{BE}$ multiplier circuit.

27. The method of claim 20 wherein reducing the DC current of the input voltage comprises reducing the DC component of the input voltage to a voltage of less than 60 volts.

28. The method of claim 20, further comprising:

reducing the DC component of the input voltage without substantially affecting a phase of the AC component of the input voltage, or reducing the DC component of the input voltage with a constant phase shift of the AC component of the input voltage, or reducing the DC component of the input voltage without substantially affecting the magnitude of the AC component of the diagnostic signal output node, to generate a reduced voltage; and providing the reduced voltage to the diagnostic signal output node of the AC signal diagnostic system via a second interface output node.

29. The method of claim 28 wherein reducing the DC current of the input voltage comprises applying the input voltage to a circuit that comprises at least one of a controlled voltage source or a constant-voltage load bank electrically coupled in series between the interface input node and the second interface output node.

30. The method of claim 29 wherein applying the input voltage to a circuit comprises applying the input voltage to a circuit that comprises a controlled voltage.

31. A low voltage interface, comprising:

an interface input node electrically coupleable to a positive node of a DC power source;

a first interface output node electrically coupleable to a measurement input node of an AC signal diagnostic system that includes a diagnostic signal output node that applies an AC signal to the DC power source; and a voltage-reduction circuit electrically coupled to the interface input node and the first interface output node and including a $V_{BE}$ multiplier circuit electrically coupled in series with a biasing current source, the voltage-reduction circuit:

receives an input voltage from the DC power source via the interface input node, the input voltage comprising a DC component and an AC component;

reduces the DC component of the input voltage without substantially affecting a magnitude or phase of the AC component of the input voltage, or reduces the DC component of the input voltage with a constant amplification or a constant phase shift of the AC component of the input voltage, which provides a measurement voltage; and provides the measurement voltage to the measurement input node of the AC signal diagnostic system via the first interface output node.

32. The low voltage interface of claim 31, wherein the biasing current source provides a zero- or constant-phase current response with respect to the output voltage.

* * * * *